United States Patent [19]
Agnello et al.

[11] Patent Number: 5,796,166
[45] Date of Patent: *Aug. 18, 1998

[54] TASIN OXYGEN DIFFUSION BARRIER IN MULTILAYER STRUCTURES

[75] Inventors: Paul David Agnello, Wappingers Falls; Cyril Cabral, Jr., Ossining; Alfred Grill, White Plains; Christopher Vincent Jahnes, Monsey; Thomas John Licata, Lagrangeville; Ronnen Andrew Roy, Briarcliff Manor, all of N.Y.

[73] Assignee: IBM Corporation, N.Y.

[*] Notice: The term of this patent shall not extend beyond the expiration date of Pat. No. 5,576,579.

[21] Appl. No.: 668,241

[22] Filed: Jun. 21, 1996

Related U.S. Application Data

[62] Division of Ser. No. 371,627, Jan. 12, 1995, Pat. No. 5,576,579.

[51] Int. Cl.$^6$ .................... H01L 21/8238; H01L 29/49
[52] U.S. Cl. .................... 257/751; 257/770; 257/413; 257/369; 257/757
[58] Field of Search .................. 257/751, 753, 257/770, 413, 369, 757

[56] References Cited

U.S. PATENT DOCUMENTS

| | | | |
|---|---|---|---|
| 4,855,798 | 8/1989 | Imamura | 257/751 |
| 5,170,242 | 12/1992 | Stevens | 257/751 |
| 5,341,016 | 8/1994 | Prall | 257/753 |
| 5,440,173 | 8/1995 | Evans | 257/751 |
| 5,440,174 | 8/1995 | Nishitsuji | 257/770 |
| 5,504,041 | 4/1996 | Summerfelt | . |

OTHER PUBLICATIONS

Reid et al., *Thin Solid Films* 236, (1993) pp. 319–324 "Evaluation of . . . (Mo, Ta, W)–Si–N . . . Metallizations".
P. J. Pokela et al., Thermal oxidation of amorphous ternary $Ta_{36}Si_{14}N_{50}$ thin films. J. Appl. Phys. vol. 70, No. 5, 1 Sep. 1991, pp. 2828–2832.

*Primary Examiner*—Jerome Jackson
*Attorney, Agent, or Firm*—Tung & Associates

[57] ABSTRACT

A multilayer structure having an oxygen or dopant diffusion barrier fabricated of an electrically conductive, thermally stable material of refractory metal-silicon-nitrogen which is resistant to oxidation, prevents out-diffusion of dopants from silicon and has a wide process window wherein the refractory metal is selected from Ta, W, Nb, V, Ti, Zr, Hf, Cr and Mo.

7 Claims, 4 Drawing Sheets

1

TASIN OXYGEN DIFFUSION BARRIER IN MULTILAYER STRUCTURES

This is a divisional of application Ser. No. 08/371,627, filed Jan. 12, 1995, now U.S. Pat. No. 5,576,579.

FIELD OF THE INVENTION

The present invention generally relates to a multilayer structure that has a base layer with or without a metal conductor layer and a refractory metal-silicon-nitrogen diffusion barrier layer deposited on top, and method of making the same and more particularly, relates to a multilayer structure that has a base layer and a refractory metal-silicon-nitrogen diffusion barrier layer deposited on top to protect the base layer from oxidation and to prevent out-diffusion of dopants in the base layer across the barrier while remaining conductive by resisting oxidation.

BACKGROUND OF THE INVENTION

In the manufacturing process of semiconductor devices, numerous processing steps involve subjecting device structures to high temperature treatments in the presence of oxygen. For instance, the fabrication of high dielectric constant oxide materials requires typical annealing conditions of 650° C. for 30 minutes while isolation of polycide gate stacks requires annealing conditions of 1050° C. for 20 seconds. In the former application, a problem which generally occurs during the fabrication of such high dielectric materials is the oxidation of the underlying silicon. The oxidation forms an insulating silica layer between high permittivity oxide and silicon substrate which eliminates the electrical contact to the underlying substrate and forms a capacitor of lower dielectric constant ($SiO_2$). Other researchers have evaluated a host of barrier layers placed between the silicon and the high dielectric layer, however, none of the evaluated materials promise to be sufficient barriers to prevent silicon oxidation.

For instance, conductive binary nitrides diffusion barrier materials such as TiN, WN and TaN are common in some VLSI applications, i.e. in contact holes, and are used to separate conductors from underlying silicon. However, most of these materials are not suitable diffusion barriers for use in the above mentioned applications because they cannot withstand the oxidation cycles that the device is subjected to. In addition, other researchers have investigated elemental metals such as Pt, Au and Ru for the prevention of diffusion of oxygen to the underlying layer of silicon and its subsequent oxidation. It was found that none of the pure metals prevented the diffusion and the resulting silica formation. A break in the electrical conduction path to the silicon substrate occurred as a result.

The conductive binary nitrides have also been evaluated for use in gate stacks. Experiments have shown that for sub-micron transistors, such conventional barriers allow oxidation to proceed from the sidewall several thousand angstroms to the gate and thereby severely degrade the high frequency performance of the device through parasitic resistance and capacitance. On the other hand, a 2.5 nm thick electrically insulating $Si_3N_4$ barrier was found to resist oxidation, yet allow electrical contact between the polysilicon and overlying metallic strap through tunneling conduction. However, this solution is not manufacturable since the tunneling current is exponentially dependent on barrier thickness, thus requiring very precise control of thickness across the wafer and among wafers.

Other researchers have attempted to eliminate the need for a diffusion barrier in the gate stack by restricting the CMOS design to a single work function gate. In this approach, only one doping type is used in the gate polysilicon, thus eliminating the problem of dopant interdiffusion. Dopant depletion is then addressed by increasing the dosage of the dopant. The drawback of this approach is that the performance of one of the devices, either a PFET or a NFET is reduced because the gate is of the opposite carrier type and thus has a less than optimal work function.

It is therefore an object of the present invention to provide a diffusion barrier for use in a multilayer device that does not have the shortcomings of the prior art diffusion barriers.

It is another object of the present invention to provide a diffusion barrier that can be fabricated in a simple manufacturing process.

It is a further object of the present invention to provide a diffusion barrier capable of sustaining the high processing temperatures encountered in semiconductor processing steps.

It is another further object of the present invention to provide an oxygen diffusion barrier for devices incorporating high dielectric constant oxide layers.

It is yet another object of the present invention to provide an oxygen diffusion barrier made of an electrically conductive material of less than several thousand µΩ-cm that is applicable to a capacitor device.

It is still another object of the present invention to provide an oxygen diffusion barrier that is electrically conductive and thermally stable for use in the growth of high dielectric constant oxide compounds on silicon substrates.

It is still another further object of The present invention to provide an oxidation-resistant dopant diffusion barrier that can be suitably used in a polycide gate stack for a CMOS device.

It is yet another further object of the present invention to provide an oxidation-resistant dopant diffusion barrier that allows the fabrication of a dual work function polycide CMOS device that is resistant to oxidation and has a wide process window.

SUMMARY OF THE INVENTION

The present invention provides a diffusion barrier made of an alloy of TaSiN of a suitable atomic ratio such that the film has an electrical resistivity less than several thousand µΩ-cm, resists oxidation and reaction with silicon and metal silicides at typical silicon processing temperatures of up to 1050° C., and resists the diffusion of oxygen or dopant atoms. The above properties make the film suitable for use as a base electrode for DRAMS, FERAMS and NVRAMS utilizing high dielectric constant insulators and as a diffusion barrier in a polycide gate stack in a CMOS device.

In the preferred embodiment, an oxygen diffusion barrier layer made of a TaSiN alloy having an atomic percent of Ta between about 20% to about 40%, of Si between about 10% to about 30% and of N between about 30% to about 60% is provided. The oxygen diffusion barrier can be used as a base electrode in DRAM, FERAM and NVRAM devices. The technique permits the use of elemental sputter targets that are more easily fabricated with high purity and at low cost.

In an alternate embodiment, the present invention diffusion barrier is provided in a preferred atomic ratio of Ta(36)Si(14)N(50) having superior dopant barrier and conductor properties. The oxidation of the barrier layer is minimized by the formation of a passivating skin of $SiO_x$ when exposed to an oxidation ambient due to the presence of Si in the structure. The dopant diffusion barrier layer can be used in a polycide gate stack of a CMOS device.

The present invention is further directed to a method of forming an oxygen or dopant barrier layer by either a chemical vapor deposition or a physical vapor deposition technique. The method can be carried out by depositing alternating layers of SiN and TaN of predetermined thicknesses. The technique permits the deposition of extremely thin layers thus simulating an alloy deposition and it allows for simple compositional control. Alternatively, a homogeneous TaSiN film lacking compositional modulation can be deposited by reactively sputtering $Ta_5Si_3$ from a monolithic target in a $N_2$ ambient which can provide better process control by reducing process complexity, or by CVD.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED AND ALTERNATE EMBODIMENTS

Figure 2:
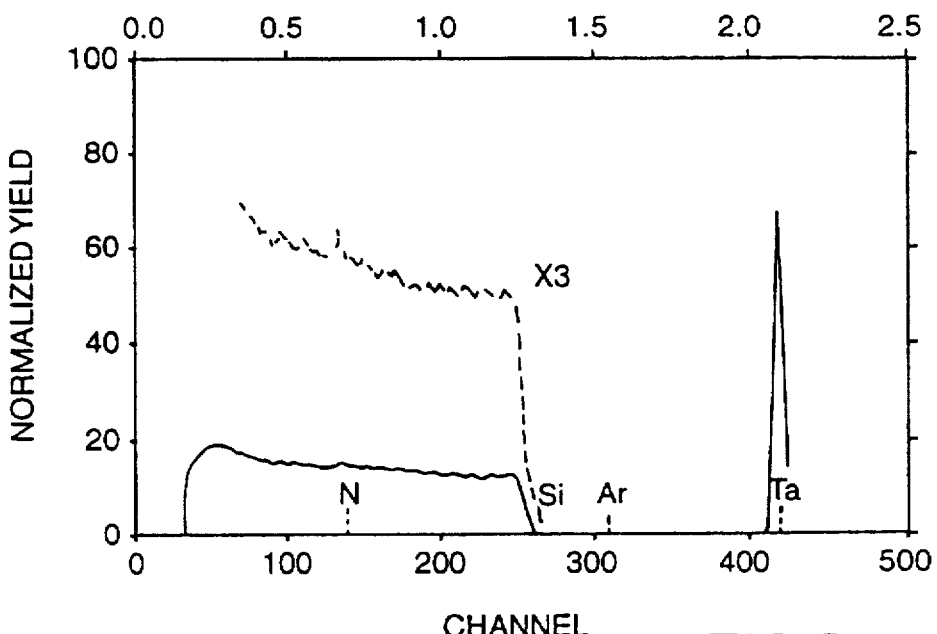
FIG. 2 is a RBS (Rutherford Backscattering) spectrum of an as deposited TaSIN film.
Figure 4:
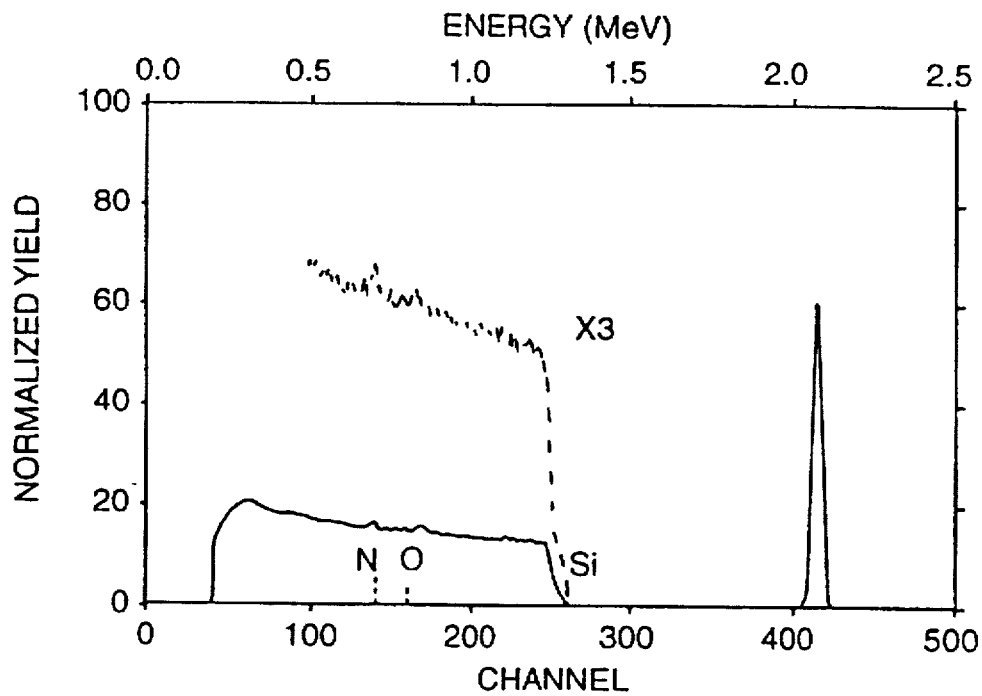
FIG. 4 is a RBS spectrum of a TaSiN film annealed 30 min in oxygen at 650° C.

In the preferred embodiment, a TaSiN composition that is electrically conductive up to several thousand µΩ-cm is suitably used as a base electrode for capacitors in DRAM's utilizing high dielectric constant insulators. The amorphous alloy of TaSiN provides an electrically conductive, thermally stable oxygen diffusion barrier suitable for use in the growth of high dielectric constant oxide compounds on multilayer structures. To evaluate the operability of TaSiN as oxygen barriers, several compositions of TaSiN were sputter deposited onto silicon substrates. The depositions were performed by co-sputtering pure Ta and Si targets in a nitrogen containing ambient. The composition was varied by either changing the relative sputtering power to the Ta and/or Si targets and also by changing the partial pressure of nitrogen in the sputtering chamber. Of the alloys tested, the Ta(31)Si(20)N(49) (determined by RBS analysis) showed the best oxygen barrier properties in that the underlying silicon substrate did not oxidize after annealing at 650° C. for 30 min in an oxygen ambient. These data are shown in FIGS. 2 and 4 which are RBS spectra taken before (FIG. 2) and after (FIG. 4) annealing.

The alloy is deposited as a material with an electrical resistance of between about 1,000 and about 2.000 µΩ-cm. These properties not only show that the TaSiN compound acts as a good oxygen diffusion barrier, but also show a good stability of the material since the microstructure and the resistivity did not change.

Figure 3:
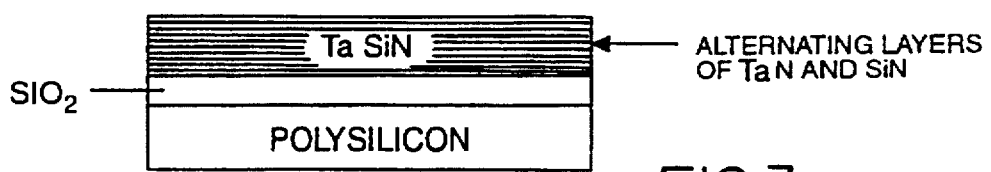
FIG. 3 is an enlarged cross-sectional view of a TaSiN film deposited on silica layer on a silicon substrate.

In the following examples of TaSiN compositions, the atomic percentage of Ta is between about 20% to about 40%, of Si is between about 10% to about 30%, and of N is between about 30% to about 60%. All percentages used in this specification are atomic percents. A sputtering apparatus is used to allow the deposition of alternating layers of SiN and TaN of predetermined thicknesses. As shown in the transmission election microscope (TEM) image of FIG. 3, the film maintains the layered microstructure even after being annealed for 1 minute at 1100° C. The apparatus allows the deposition of the layers extremely thin and thus simulating an alloy deposition. When the layers are made slightly thicker, i.e., still less than 10 nm, it has the effect of lowering the resistivity of the TaSiN alloy for a given composition without compromising the barrier properties. In the following examples, structures are made for the examination of oxygen diffusion through the barriers. This is important in the fabrication of high dielectric constant capacitors. The goal of the experiment is to find a barrier that does not allow oxygen permeation at high temperatures, while remaining electrically conductive and not interdiffused with the Pt seed layer or the Si substrate.

In place of the Si substrate, a conducting layer selected from the group consisting of Ta, W, Nb, V, Ti, Zr, Hf, Cr, Mo, Pt, Ru, and silicides thereof may be used. Or, between the Si substrate and the TaSiN layer, a conducting layer selected from the group consisting of Ta, W, NB, V, Ti, Zr, Hf, Cr, Mo, Pt, Ru and silicides thereof may be placed. The conducting layer may form the base or bottom electrode or one layer of the bottom electrode of a capacitor formed of high dielectric material.

EXAMPLE 1

A Ta(21)Si(35)N(44) film of 80 nm thick is deposited on a silicon substrate with a layer thickness not exceeding 10 nm/layer. The substrate was then heated to 700° C. in a pure oxygen ambient and held at 700° C. for 5 min. Using Rutherford Backscattering (RBS) analysis, the silicon substrate was found to be free of oxygen after annealing.

EXAMPLE 2

A Ta(25)Si(35)N(40) film is deposited on a silicon substrate with a layer thickness not exceeding 10 nm/layer. The sample is then heated to 700° C. in a pure oxygen ambient and held at 700° C. for 5 min. Using RBS analysis, the silicon substrate was found to be free of oxygen after annealing.

EXAMPLE 3

A Ta(26)Si(36)N(38) film is deposited on a silicon substrate with a layer thickness not exceeding 10 nm/layer. The sample is then heated to 700° C. in a pure oxygen ambient and held at 700° C. for 5 min. Using RBS analysis, the silicon substrate was found to be free of oxygen. Additionally, electrical measurements were performed both before and after annealing and the sheet resistance was unchanged at 44 Ω/□.

EXAMPLE 4

A Ta(30)Si(29)N(41) film is deposited on a silicon substrate with a layer thickness not exceeding 10 nm/layer. The structure is then annealed at 700° C. for 5 min in an oxygen containing atmosphere. RBS analysis of the annealed structure showed no oxidation of the silicon substrate and there was no interdiffusion between the TaSiN and the Pt layers.

EXAMPLE 5

Figure 1:
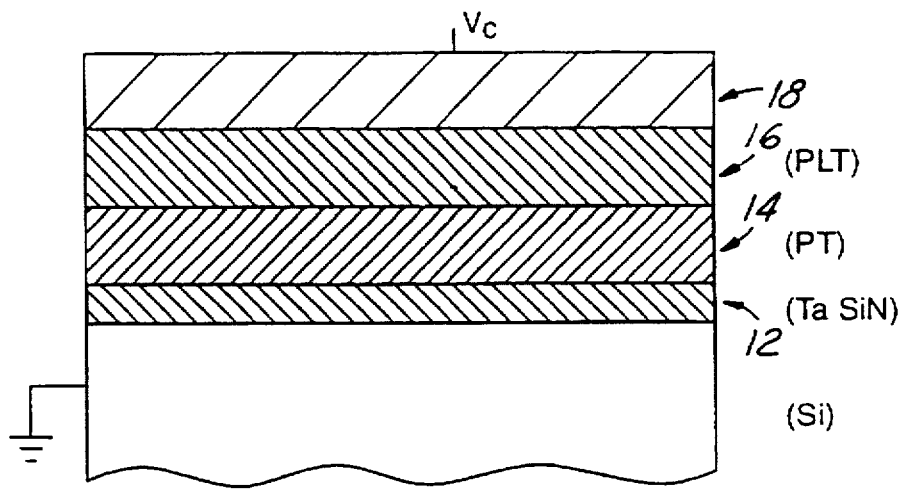
FIG. 1 is an enlarged cross-sectional view of a silicon substrate having a TaSiN diffusion barrier Layer, a platinum seed layer and a PLT layer of high dielectric constant deposited thereon.

A Ta(31)Si(21)N(48) film of 80 nm thick is deposited on a silicon substrate 20 at a higher rotational speed which resulted in a layering thickness of less than 1 nm/layer. The structure 10 is illustrated in FIG. 1. The TaSiN layer 12 has a sheet resistance of 351 Ω/□. A 100 nm platinum layer 14 was then deposited onto the TaSiN layer. A Pb(14.4)La(5.6)Ti(20)0(60) (commonly known as PLT) of high dielectric constant material 16 is spun onto the sample using a sol-gel process. A metal contact layer 18 is deposited on top for providing electrical contact. The entire structure 10 is annealed in oxygen at 700° C. Using X-ray diffraction, the PLT is found to be 100% Perovskite after annealing. Using RBS analysis, the silicon substrate was found to be free of oxygen and there was no evidence of interdiffusion.

Figure 5:
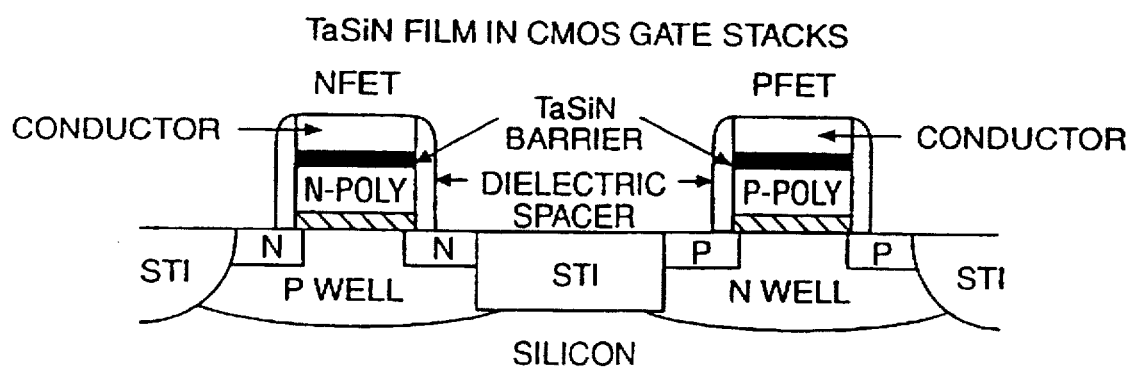
FIG. 5 is an enlarged cross-sectional view of a polycide gate stack with TaSiN barrier layers.

In an alternate embodiment, a present invention oxidation resistant dopant diffusion barrier layer is formed in a polycide gate stack utilized in a CMOS device, as illustrated schematically in FIG. 5. In modern semiconductor devices where dimensions continue to shrink, it is desirable to form gate 10 conductors by patterning composite stacks of polysilicon and a refractory material (polycide) such as $TiSi_2$, $WSi_2$ or W. It is desirable since the polycide approach allows decoupling of the conductor on the gate stack from that on the single crystal silicon regions where shallow junctions restrict the silicide thickness. Furthermore, a polycide stack can have a built-in, self-aligned etch stop on top of the gate conductor for use in fully overlapped contacts to the single crystal silicon region. This permits increased circuit density. Also, materials which are not suitable for self-aligned salicidation such as W can be used.

Figure 6:
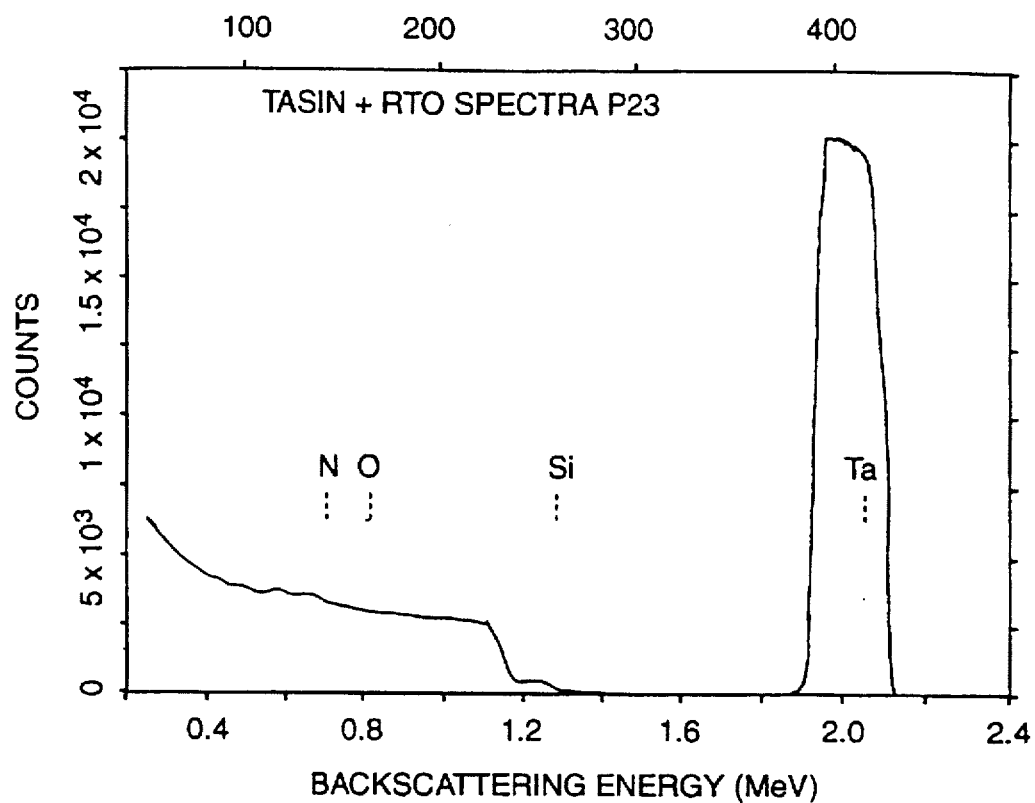
FIG. 6 is a RBS spectrum of a TaSiN film after 1050° C., 20 sec oxidation anneal.
Figure 7:
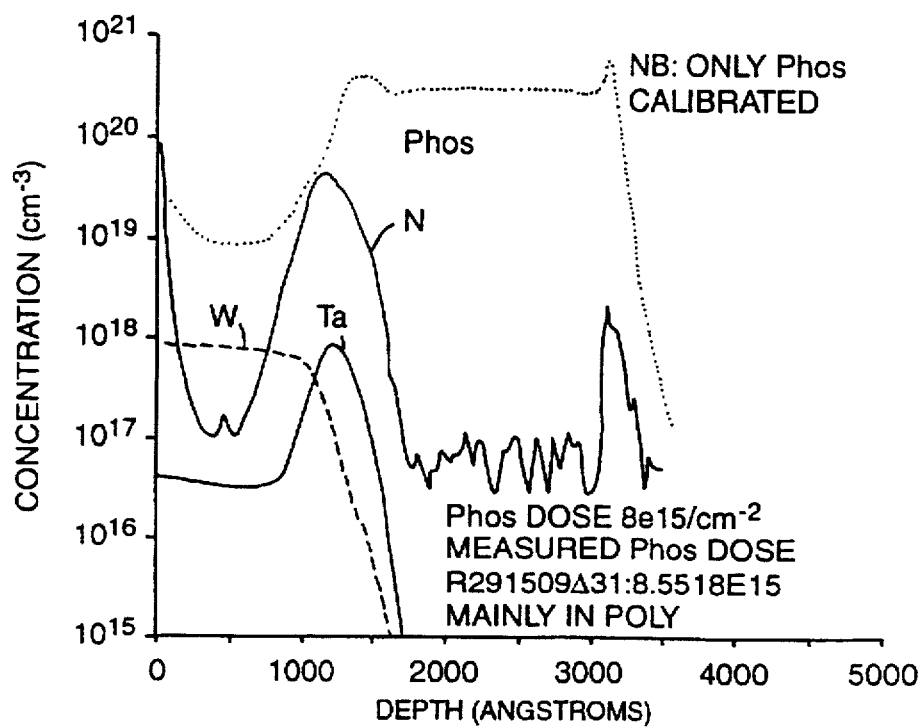
FIG. 7 is a SIMS of phosphorus-dopant profile in polycide gate stack with a 10 nm thick Ta(36)Si(14)N(50) barrier layer after 1050° C., 30 sec $N_2$ anneal.
Figure 8:
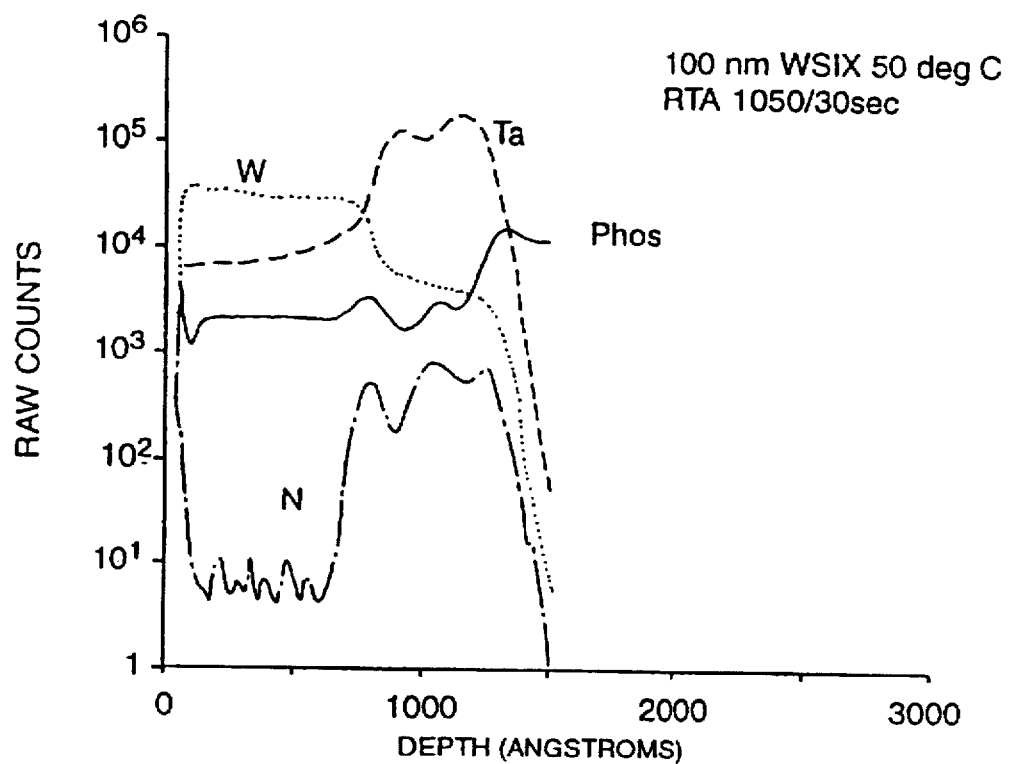
FIG. 8 is a SIMS of phosphorus-dopant profile in polycide gate star with a 30 nm thick Ta(52)Si(23)N(25) barrier layer after 1050° C., 30 sec $N_2$ anneal.

The present invention method overcomes the problems frequently encountered in a conventional polycide process where the refractory metal or silicide is present much earlier in the process sequence, and thus must withstand high temperature cycles and harsh chemical environments such as oxidation and wet etches. Common dopants such as B, P and As diffuse into and/or react with the polycide, severely depleting the underlying polysilicon layer in the device, and diffusing laterally thereby shifting the threshold voltage of adjacent devices of different dopant type. The present invention provides a solution by introducing a diffusion barrier between the gate poly and the conductor. By depositing a layer of TaSiN with a suitable stoichiometry, unlike other barrier materials, the combination of the incorporated Si minimizes the extent of oxidation through the formation of a thin passivating skin of $SiO_x$. The RBS spectra of a 100 nm Ta(36)Si(14)N(50) film shown in FIG. 6 indicates that an oxygen anneal of 1050° C. for 20 sec results in no appreciable oxidation of the bulk TaSiN film. In contrast, separate experiments under similar conditions have shown that TiN oxidizes across the entire film thickness. Furthermore, by controlling the stoichiometry of the film, the diffusion barrier can be fabricated at a useful specific resistivity of 625 µΩ-cm, while still maintaining its oxidation resistance and barrier properties. For example, FIG. 7 shows a secondary ion mass spectroscopy (SIMS) depth profile of a phosphorus-doped gate electrode after a 1050° C. 30 sec $N_2$ anneal. The P remains well-localized in the poly due to the barrier action of the optimized TaSiN film. In contrast, FIG. 8 shows extensive P diffusion when a sub-optimum Ta(52)Si(23)N(25) barrier of 30 nm thickness was subjected to the same heat treatment.

The process of the alternate embodiment can be carried out as follows. First, a poly layer is deposited on a gate oxide and followed by ion implantation of the gate dopants in the various regions of the wafer, as in a conventional processing for a polycide gate structure. Then, instead of depositing a gate conductor such as $TiSi_2$, a 5 nm to 30 nm thick diffusion barrier of TaSiN is deposited by reactive sputtering from a $Ta_5Si_3$ cathode in an Ar ambient containing approximately 50% nitrogen gas. The Ta:Si ratio can be adjusted by using a target of different composition. Alternatively, sputtering may be carried out using multiple elemental cathodes. In this case, a platen holding the wafers to be coated is rotated under Ta and Si targets in an $Ar/N_2$ ambient. The ratio of Ta/si is then controlled by varying the cathode powers. For either deposition method, the film's nitrogen content is primarily controlled by adjusting the $Ar/N_2$ ratio. A nitrogen content in the film of about 50% is desirable to achieve the optimal diffusion barrier and oxidation resistance properties while still maintaining reasonable resistivity. Specific resistivity of 625 µΩ-cm has been reproducibly obtained. After the film deposition, the polycide processing proceeds in the standard fashion of depositing the conductor, patterning the gate, defining the gate by RIE and then oxidizing the gate stack.

The present invention allows the fabrication of a dual work function polycide CMOS with a dopant diffusion barrier that is resistant to oxidation. The process has a wider process window than the tunneling barrier technique using $Si_3N_4$ because it is electrically conductive.

While the present invention has been described in an illustrative manner, it should be understood that the terminology used is intended to be in the nature of words of description rather than of limitation.

Furthermore, while the present invention has been described in terms of a preferred embodiment thereof, it is to be appreciated that those skilled in the art will readily apply these teachings to other possible variations of the invention. For instance, other refractory metals such as W, Nb, V, Ti, Zr, Hf, Cr and Mo can also be used to replace Ta in the compositions.

The embodiments of the invention in which an exclusive property or privilege are claimed are defined as follows:

1. A semiconductor structure comprising:
   a silicon base layer having a top surface, and a refractory metal-silicon-nitrogen diffusion barrier layer adhered to the top surface of said silicon base layer, said diffusion barrier layer is deposited between a silicon base layer and a contact layer with a high permittivity oxide film deposited on top of said contact layer,
   whereby said refractory metal-silicon-nitrogen layer protects said silicon base layer from oxidation upon contact with oxygen by the semiconductor structure.

2. A semiconductor structure according to claim 1, wherein said contact layer is made of at least one oxidation resistant metal selected from the group consisting of Pt, Ir and Au, or an electrically conductive oxide selected from the group of $RuO_2$, $IrO_2$, and $Re_2O_3$.

3. A semiconductor structure according to claim 1, wherein said structure is a capacitor which further comprises an oxidation resistant contact layer, a high permittivity oxide layer and a contact electrode.

4. A semiconductor structure according to claim 1, wherein said structure is a polycide gate stack in a CMOS device.

5. A capacitor in a semiconductor device comprising:
   a silicon substrate,
   a refractory metal-silicon-nitrogen diffusion barrier layer,
   an oxidation resistant contact layer,
   a high permittivity oxide layer, and
   a contact metal electrode layer.

6. A capacitor according to claim 5, wherein said refractory metal is selected from the group consisting of Ta, W, Nb, V, Ti, Zr, Hf, Cr and Mo.

7. A capacitor according to claim 5, wherein said refractory metal-silicon-nitrogen diffusion barrier layer is a TaSiN layer.

* * * * *